United States Patent
Huang et al.

(10) Patent No.: US 6,996,448 B2
(45) Date of Patent: Feb. 7, 2006

(54) TRANSPORT SYSTEM WITH MULTIPLE-LOAD-PORT STOCKERS

(75) Inventors: Chien-Jung Huang, Hsinchu (TW); Nain-Sung Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/725,653

(22) Filed: Dec. 2, 2003

(65) Prior Publication Data

US 2005/0119787 A1     Jun. 2, 2005

(51) Int. Cl.
*G06F 19/00*   (2006.01)
*G06F 7/00*    (2006.01)

(52) U.S. Cl. .................. 700/112; 700/228; 700/230
(58) Field of Classification Search ............... 700/112, 700/113, 228, 230
See application file for complete search history.

(56) References Cited

U.S. PATENT DOCUMENTS 5,980,183 A * 11/1999 Fosnight ............... 414/222.01
6,169,935 B1 * 1/2001 Iwasaki et al. ........... 700/214
6,580,967 B2 * 6/2003 Jevtic et al. .............. 700/228
6,745,102 B1 * 6/2004 Liu ........................ 700/228
6,931,303 B2 * 8/2005 Chang et al. ............ 700/228

* cited by examiner

*Primary Examiner*—Albert W. Paladini
*Assistant Examiner*—Ryan A. Jarrett
(74) *Attorney, Agent, or Firm*—Thomas, Kayden, Horstemeyer & Risley

(57) ABSTRACT

A transport system for a fabrication system. The fabrication system contains a plurality of tools for processing articles. The transport system contains a stocker subsystem and a track subsystem. The stocker subsystem contains a stocker body for storing the articles and a plurality of load ports. The load ports are located on the stocker body, enabling the articles to be transferred between the stocker body and the track subsystem. The number of the load ports depends on properties of the tools. The track subsystem contains a delivery part and a load part, wherein the load part contains a plurality of branches corresponding to the load ports.

6 Claims, 6 Drawing Sheets

TRANSPORT SYSTEM WITH MULTIPLE-LOAD-PORT STOCKERS

BACKGROUND OF THE INVENTION

1. Field of the Invention

The present invention relates to a transport system, and particularly to a transport system capable of conveying articles in a fabrication system.

2. Description of the Related Art

In a conventional fab, wafer processing steps are performed in discrete areas (bays). Wafers must be transported between bays (interbay) and within bays (intrabay). FIG. 1 is a schematic view showing a conventional fabrication system layout. A fabrication system 100 capable of fabricating semiconductor wafers comprises tool bays 11 and 15, and a plurality of transport systems.

Each tool bay comprises, in general, a number of tools for performing various wafer fabrication functions. For example, tool bays 11 and 15 comprise tools 11a to 11h, and tools 15a to 15h respectively. The transport system uses carriers for storing and transporting wafers. Within the fabrication system 100, an interbay transport system 19 transfers carriers between tool bays; intrabay transport systems 12 and 16 transport carriers within tool bays 11 and 15 respectively. Wafers cannot be transported between interbay transport systems and intrabay transport systems directly, but are transferred through stockers located at the end of bays. As shown in FIG. 1, stockers 13 and 17 serve tool bays 11 and 15 respectively. Stocker 13 has interbay load ports 139a, 139b and intrabay load ports 131a, 131b for transporting wafers to and from interbay transport system 19 and intrabay transport system 12 respectively. Stocker 17 has interbay load ports 179a, 179b and intrabay load ports 171a, 171b for transporting wafers to and from interbay transport system 19 and intrabay transport system 16 respectively.

Interbay transport usually originates and terminates in stockers, where the wafers wait for the availability of the correct tool for the next step. Generally, a fab with 25,000 wafer starts per month might perform an average of 200–300 interbay moves per hour, with peak loading up to 500 moves per hour. An intrabay move involves removing wafers from the end-of-bay stocker and moving them to the first tool, and then from tool to tool within the bay, often requiring intermediate returns to the stocker to wait for the next tool's availability. Therefore, traffic density and intensity between the interbay transport system and the stocker increase with fabrication complexity. Conventionally, an end-of-bay stocker has one set of interbay and intrabay load ports for handling traffic between the end-of-bay stocker and the interbay and intrabay transport systems respectively. Each load port of the end-of-bay stocker serves as the only passage for wafers being transported to and from the stocker.

Such conventional fabrication system is prone to traffic jams at the load ports of stockers, and long delivery time and low transport capacity. Traffic jams in transport system result in not only long but also unpredictable delivery time, which causes difficulty in equipment scheduling and increases idle time in tools. As shown in FIG. 7, because of the frequently occurring traffic jams, a tool of the conventional fabrication system idles in wait for wafers available for processing. The idle time is presented as I in FIG. 7.

Hence, there is a need for a transport system better addressing the transport capacity problems arising from the existing technology.

SUMMARY OF THE INVENTION

Accordingly, an object of the invention is to provide a transport mechanism which reduces waiting time at load ports of stockers and increases overall transfer throughput.

To achieve the above object, the present invention provides a transport system within a fabrication system. The fabrication system contains a plurality of tools for processing articles. The transport system contains a stocker subsystem and a track subsystem. The stocker subsystem contains a stocker body for storing the articles and a plurality of load ports. The load ports are located on the stocker body, enabling the articles to be transferred between the stocker body and the track subsystem. The number of the load ports depends on properties of the tools. The track subsystem contains a delivery part and a load part, wherein the load part contains a plurality of branches corresponding to the load ports.

The tools within the fabrication system are organized into a plurality of tool bays. In this case, an interbay transport system moves articles from one stocker to another, and a plurality of intrabay transport systems deliver articles within each tool bay. The transport system described above can be applied to the interbay and/or intrabay transport system.

When the transport system is implemented in intrabay use, the load ports serve as intrabay load ports to deliver the articles between the stocker body and the tools within the tool bay. The delivery part connects tools within the tool bay. The load part, connected to the delivery part and the load ports, contains a plurality of branches corresponding to the load ports.

When the transport system is implemented in interbay use, the load ports serve as interbay load ports to deliver the articles between tool bays. The delivery part connects tool bays within the fabrication system. The load part, connected to the delivery part and the load ports, contains a plurality of branches corresponding to the load ports.

The present invention also provides a transport method for controlling transport of articles in the transport system mentioned above. First, the targeted tool of the articles is determined. Second, an optimal load port and corresponding branch to deliver the articles is determined according to the status of the targeted tool, the load parts, and the load ports. Next, a transport demand is issued to direct the transport system to transport the articles in accordance with the route.

The above-mentioned method may take the form of program code embodied in tangible media. When the program code is loaded into and executed by a machine, the machine becomes an apparatus for practicing the invention.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The present invention will now be described with reference to FIG. 2 to 6, which in general relate to a transport system within a fabrication system. While the preferred embodiment of the invention operates with semiconductor fabrication systems, it is understood that the type of article processed by the fabrication system is not critical to the present invention, and any fabrication system having transport systems with end-of-bay stockers may operate with the present invention. Additionally, it is contemplated that workpiece other than semiconductor wafers may be provided within the carriers used in the present invention, including reticles, flat panel displays, and other substrates which may be stored and/or conveyed within carriers.

Figure 1:
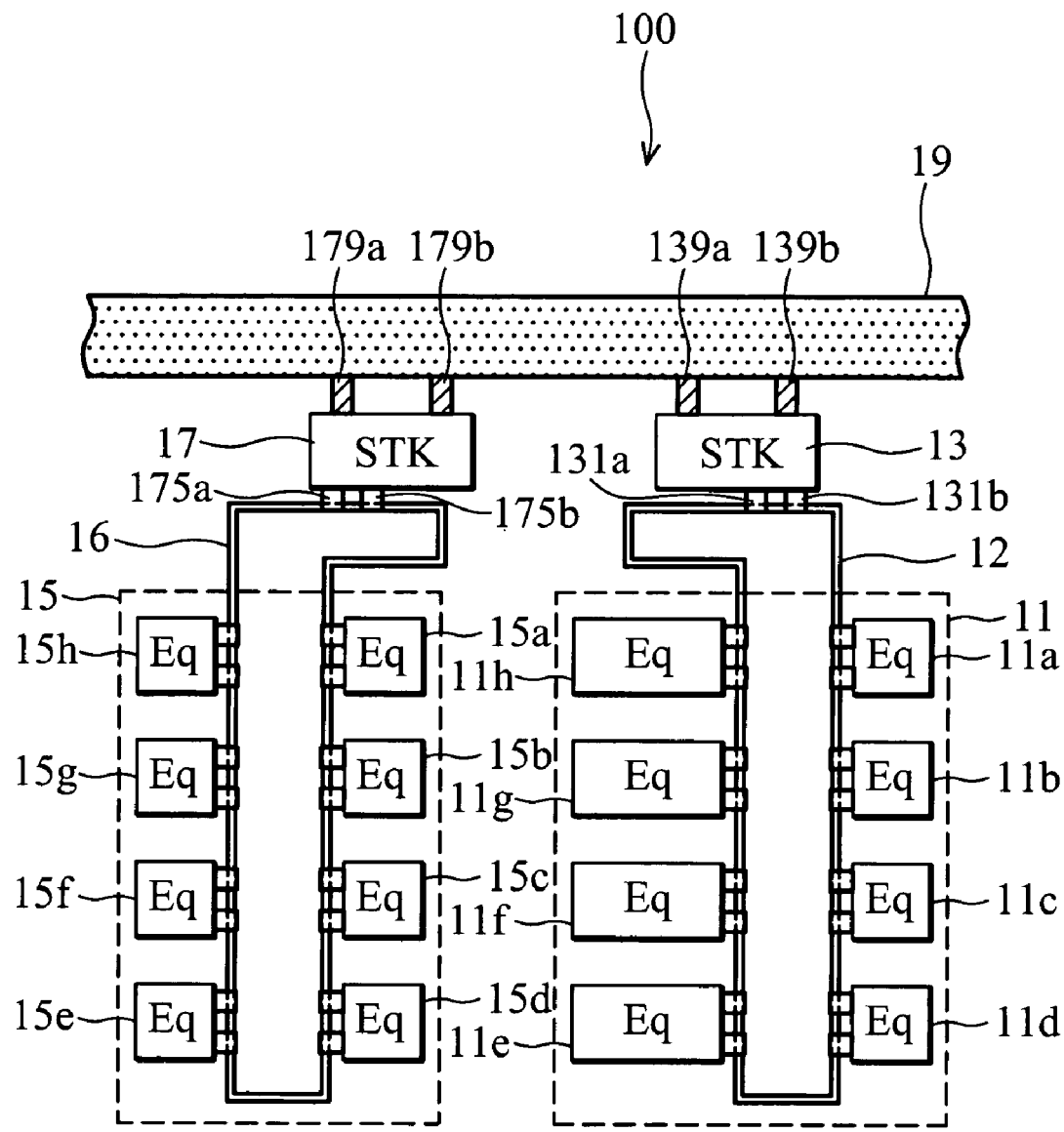
FIG. 1 is a schematic view showing a fabrication system layout as referenced in the Prior Art.
Figure 2:
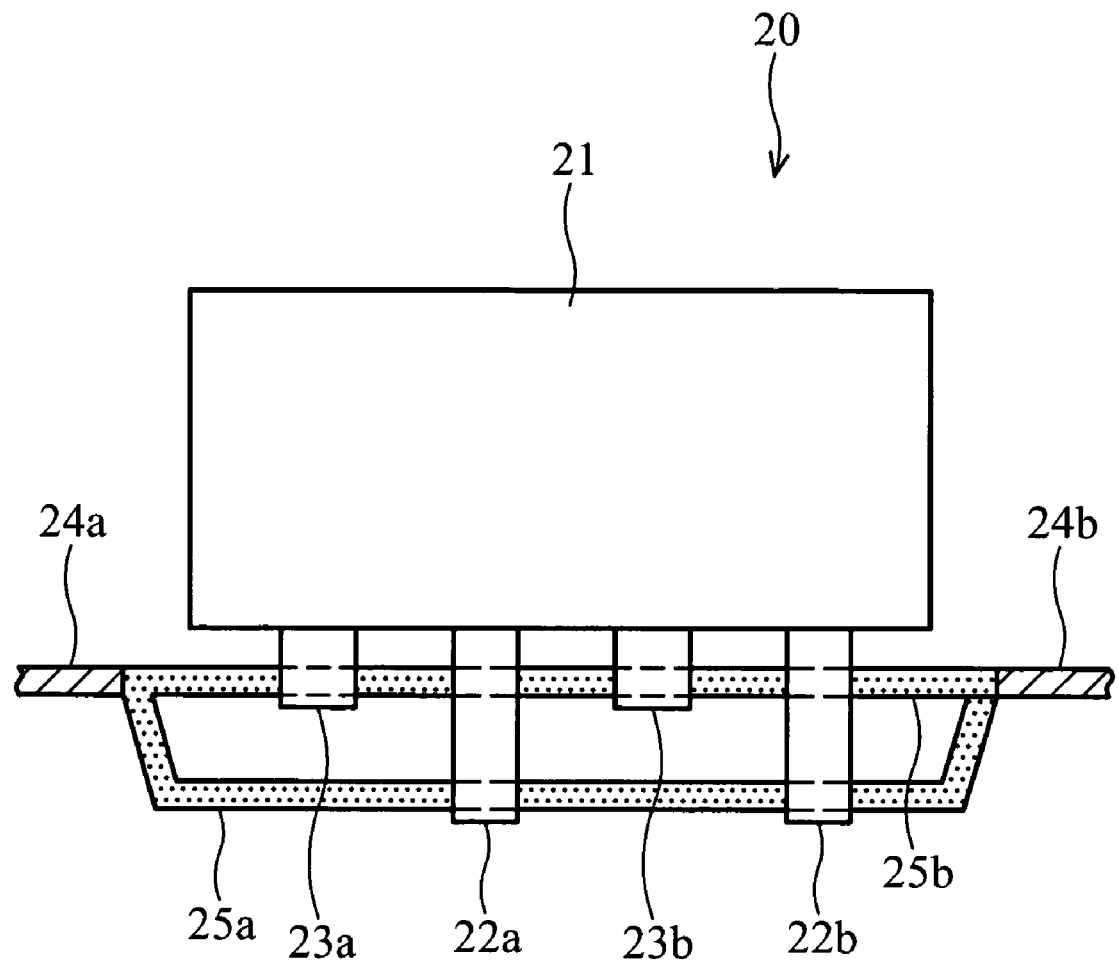
FIG. 2 is a schematic view showing a transport system according to the present invention.

FIG. 2 shows a transport system according to the present invention. A transport system 20 is implemented in a fabrication system (not shown in FIG. 2), which contains a plurality of tools for performing various wafer fabrication functions. Transport system 20 contains a stocker subsystem and a track subsystem. The stocker subsystem contains a stocker body 21, and load ports 22 and 23. Load ports 22 and 23 contain input ports 22a and 23a, and output ports 22b and 23b respectively. Load ports 22 and 23 are located on the stocker body, enabling the articles to be transferred between stocker body 21 and the track subsystem. The track subsystem contains a delivery part 24 and a load part 25. The delivery part 24 contains two sections 24a and 24b. The load part 25, linked with the delivery part 24, contains two branches 25a and 25b, which corresponds to load ports 22 and 23 respectively.

Using FIG. 2 as an example, load ports 22 and 23 are located along a wall of stocker body 21. In practice, the number and arrangement of load ports on stocker body 21 depend on factors such as processing, tool properties and factory layout. The branches of the load part 25 are arranged in accordance with the corresponding load ports. For example, smaller lot size and single-wafer processing increase the transport volume of load ports on the stocker body. When transport delays occur at the load ports on the stocker body, there is a need for multiple load ports thereon. Stockers with multiple load ports can reduce idle time of a tool spent waiting for lots to be delivered and enable continuous processing.

Transport system 20, when applied in different parts of the fabrication system, creates varying results on the delivery performance thereof. Generally, the tools within the fabrication system are organized into a plurality of tool bays. An interbay transport system moves articles from one stocker to another, and a plurality of intrabay transport systems deliver articles within each tool bay. Transport system 20 can be applied to the interbay and/or intrabay transport system.

Figure 3:
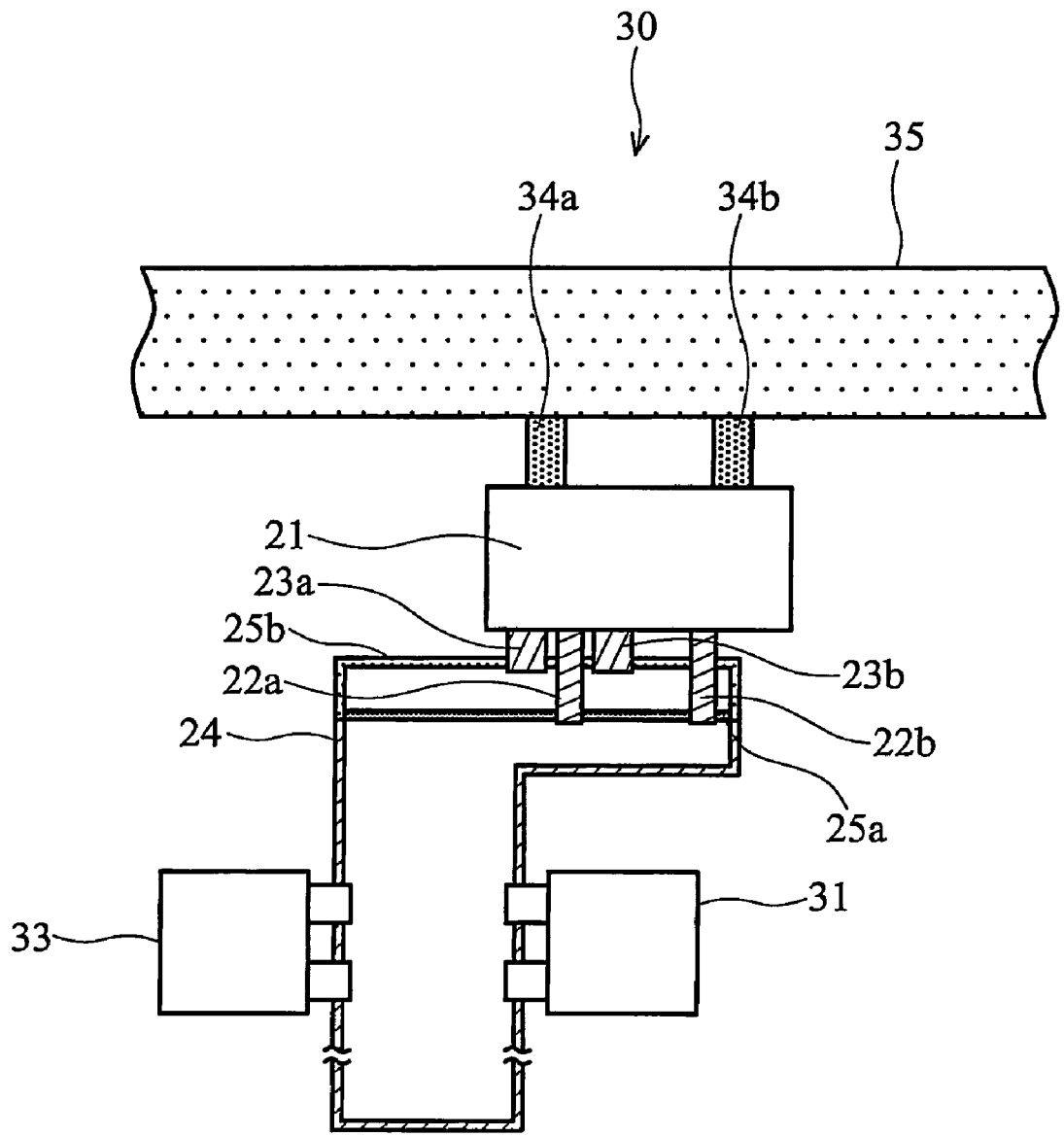
FIG. 3 is a schematic view showing a transport system according to the present invention.

Using FIG. 3 as an example, when transport system 20 is implemented in an intrabay situation, load ports 22 and 23 serve as intrabay load ports to deliver the articles between stocker body 21 and the tools such as tools 31 and 33 within tool bay 30. Delivery part 24 connects tools within tool bay 30. Load part 25, connected to delivery part 24 and load ports 22 and 23, contains branches 25a and 25b corresponding to load ports 22 and 23 respectively. Stocker body 21, linked with interbay transport system 35 with interbay load port 34, contains an input port 34a and an output port 34b.

When there is a need for an additional intrabay load port on stocker body 21, a new intrabay load port can be provided or interbay load port 34 can serve as an intrabay load port. If the interbay load port 34 is used for intrabay transport, an additional branch is built to link the interbay load port 34 to delivery part 24.

Transport system 20 implemented in intrabay situation improves delivery performance of an intrabay transport system by adding load ports to the stocker body and building corresponding branches.

Figure 4:
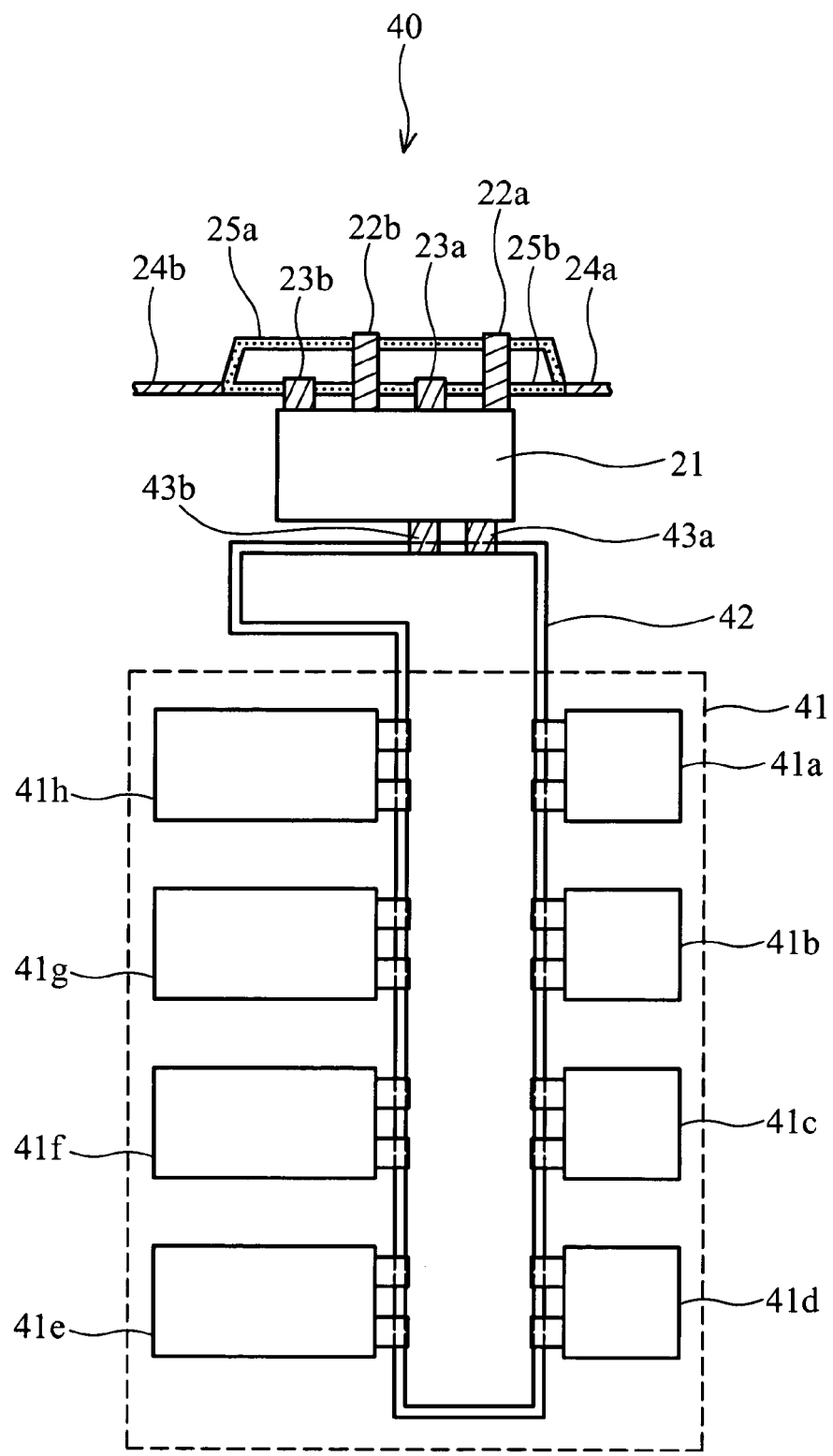
FIG. 4 is a schematic view showing a transport system according to the present invention.

Using FIG. 4 as an example, when transport system 20 is implemented in an interbay situation, load ports 22 and 23 serve as interbay load ports to deliver the articles from one stocker to another. Fabrication system 40 has a plurality of tool bays, stockers, and a plurality of intrabay transport systems and an interbay transport system. FIG. 4 shows part of fabrication system 40. Tool bay 41 contains tools 41a to 41h for processing wafers. Intrabay transport system 42, linked with intrabay load port 43, connects tools within tool bay 41. Intrabay transport system 42 contains an input port 43a and an output port 43b for communicating with stocker body 21. Delivery part 24 connects tool bays within fabrication system 40. Load part 25, connected to delivery part 24 and load ports 22 and 23, contains branches 25a and 25b corresponding to load ports 22 and 23 respectively.

When there is a need for an additional interbay load port on stocker body 21, a new interbay load port can be provided or intrabay load port 43 can serve as an interbay load port. If the intrabay load port 43 is used for interbay transport, an additional branch is built to link the intrabay load port 43 to delivery part 24.

Transport system 20 implemented in interbay situation improves delivery performance of an interbay transport system by adding load ports to the stocker body and building corresponding branches.

Figure 5:
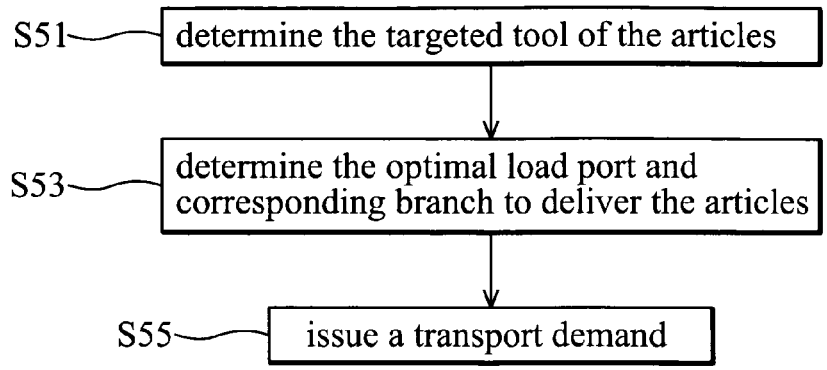
FIG. 5 is a flowchart showing the transport operation of the present invention.

The present invention also provides a transport method, shown in FIG. 5, for controlling transport of articles in transport system 20. First, the targeted tools determined in step S51. Second, an optimal load port and corresponding branch to deliver the articles are determined according to the status of the targeted tool, the load parts, and the load ports (step S53). Next, a transport demand is issued to direct the transport system to transport the articles in accordance with the route (step S55).

The above method is implemented by cooperation of several control systems in a fabrication system, such as the real-time dispatch system, manufacturing execution system, operation job system, material control system, and equipment automation system.

The method of the present invention, or certain aspects or portions thereof, may take the form of program code (i.e. instructions) embodied in a tangible media, such as floppy diskettes, CD-ROMS, hard drives, or any other machine-readable storage medium, wherein, when the program code is loaded into and executed by a machine, such as a computer, the machine becomes an apparatus for practicing the invention. The methods and apparatus of the present invention may also be embodied in the form of program code transmitted over some transmission medium, such as electrical wiring or cabling, through fiber optics, or via any other form of transmission, wherein, when the program code is received and loaded into and executed by a machine, such as a computer, the machine becomes an apparatus for practicing the invention. When implemented on a general-purpose processor, the program code combines with the processor to provide a unique apparatus that operates analogously to specific logic circuits.

Figure 6:
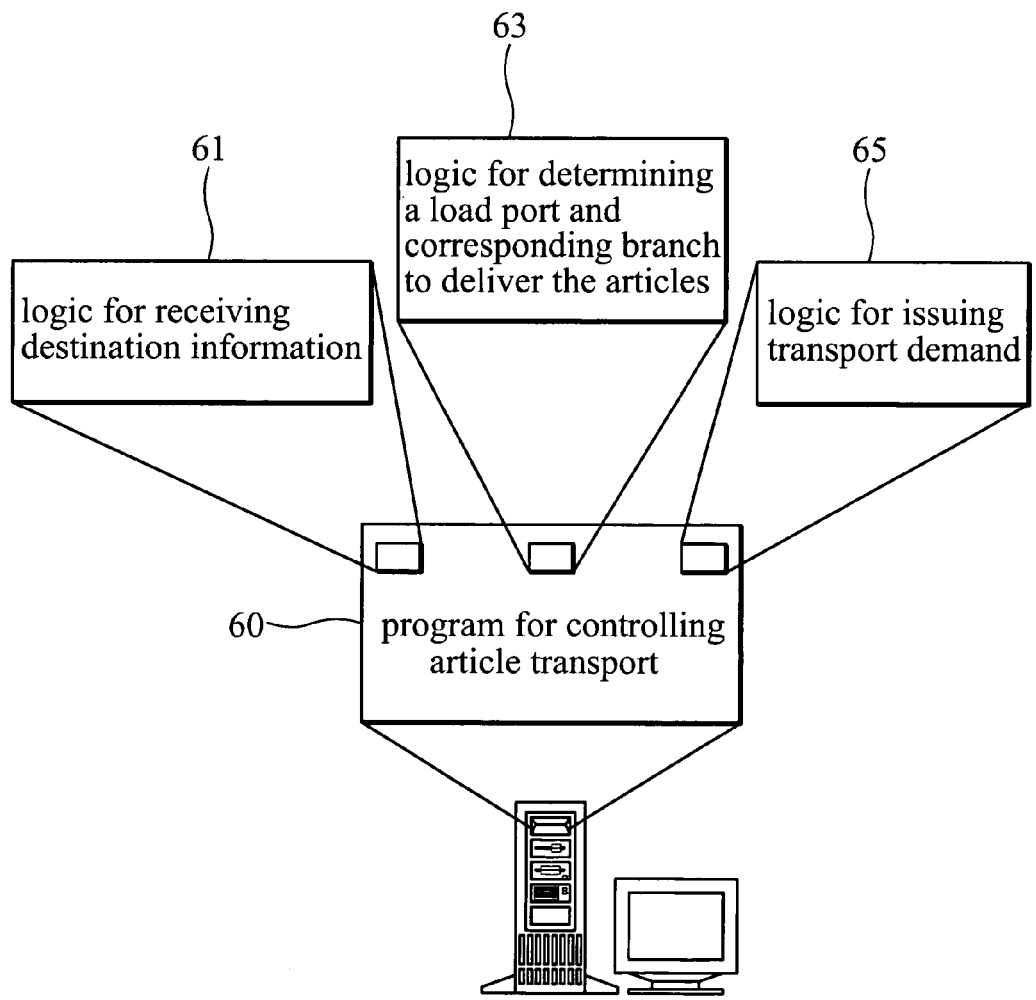
FIG. 6 is a diagram of a storage medium for storing a computer program providing the transportation method according to the present invention.
Figure 7:
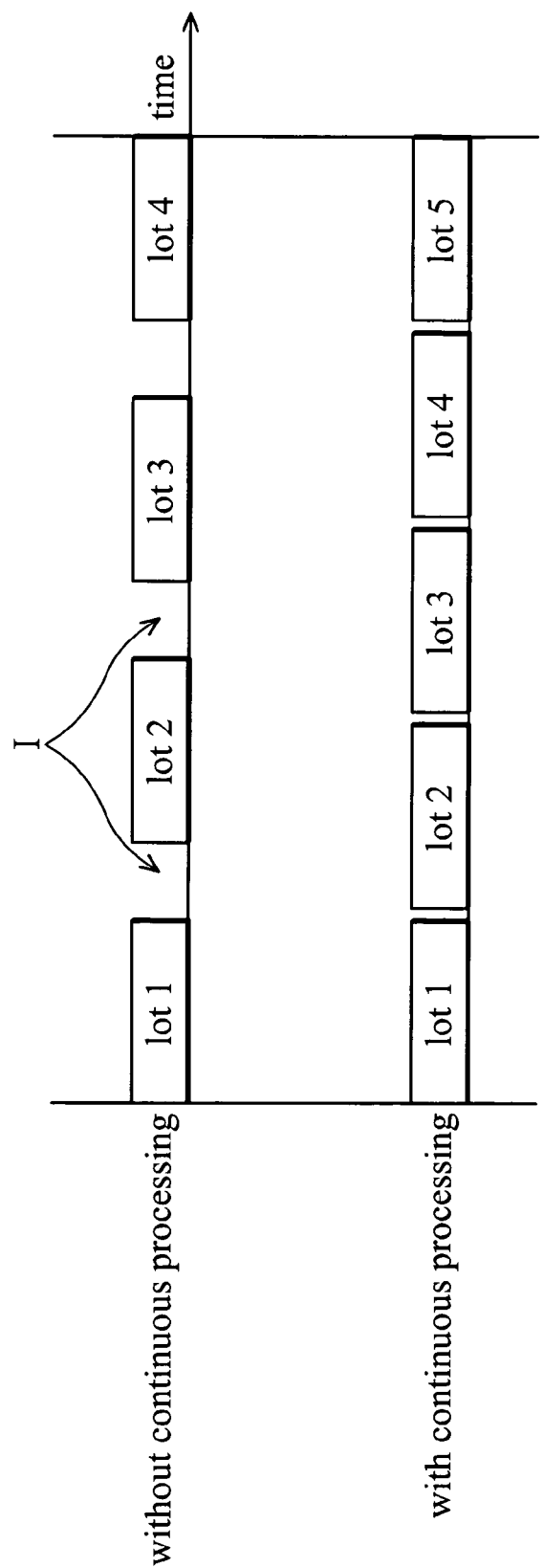
FIG. 7 illustrates output improvement when idle time is eliminated.

FIG. 6 is a diagram of a storage medium for storing a computer program providing the transport method according to the present invention. The computer program product comprises a computer storage medium having computer readable program code embodied therein, the computer readable program code 60 comprising computer readable program code 61 for receiving destination information recording the targeted tool of the articles, a computer readable program code 63 for determining a load port and corresponding branch to deliver the articles in accordance with the status of the targeted tool, the load parts, and the load ports, and a computer readable program code 65 for issuing a transport demand, which directs the transport system to transport the articles in accordance with the route.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A transport system within a fabrication system, the fabrication system comprising a plurality of tools for processing articles, the transport system comprising a stocker and a track subsystems, wherein:
   the stocker subsystem comprises:
      a stocker body for storing the articles;
      a plurality of first load ports, located on the stocker body, enabling the articles to be transferred between the stocker body and the track subsystem; and
   the track subsystem comprises a delivery part and a load part comprising a plurality of branches corresponding to the first load ports, wherein the branches of the load part transfer the articles in the same direction, and both ends of the branches are connected to the delivery part.

2. The transport system as claimed in claim 1, wherein the articles are semiconductor wafers.

3. The transport system as claimed in claim 1, wherein the stocker body further comprises a second load port enabling the articles to be transferred between the stocker body and an outside system.

4. A fabrication system, comprising:
   a plurality of tools for processing articles; and
   a transport system comprising a stocker subsystem and a track subsystem, wherein:
      the stocker subsystem comprises:
         a stocker body for storing the articles;
         a plurality of first load ports, located on the stocker body, enabling the articles to be transferred between the stocker body and the track subsystem; and
      the track subsystem comprises delivery and load parts, the load parts comprising a plurality of branches corresponding to the first load ports, wherein the branches of the load part transfers the articles in the same direction, and both ends of the branches are connected to the delivery part.

5. The fabrication system as claimed in claim 4, wherein the articles are semiconductor wafers.

6. The fabrication system as claimed in claim 4, wherein the stocker body further comprises a second load port enabling the articles to be transferred between the stocker body and an outside system.

* * * * *